(12) United States Patent
Lee

(10) Patent No.: US 6,207,574 B1
(45) Date of Patent: Mar. 27, 2001

(54) METHOD FOR FABRICATING A DRAM CELL STORAGE NODE

(75) Inventor: Kang-Yoon Lee, Sungnam-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/353,024

(22) Filed: Jul. 13, 1999

(30) Foreign Application Priority Data

Jul. 13, 1998 (KR) .................................................. 98-28191

(51) Int. Cl.[7] .............................. H01L 21/311; C03B 1/02
(52) U.S. Cl. ........................ 438/703; 438/737; 438/743; 438/744; 117/8; 427/579; 427/588; 427/99; 427/255.37; 427/255.7
(58) Field of Search ....................... 117/8, 930; 438/597, 438/684, 660, 703, 737, 740, 743, 744, 253–256, 396–399; 427/579, 588, 589, 96, 99, 255.27, 255.37, 255.394, 255.7

(56) References Cited

U.S. PATENT DOCUMENTS 5,763,286 * 6/1998 Figura et al. ........................ 438/255
6,080,622 * 6/1998 Kang .................................... 438/253

* cited by examiner

Primary Examiner—Benjamin L. Utech
Assistant Examiner—Donald L. Champagne
(74) Attorney, Agent, or Firm—The Law Offices of Eugene M. Lee, PLLC; Eugene M. Lee, Esq.

(57) ABSTRACT

A dynamic random access memory (DRAM) cell storage node and a fabricating method thereof are provided. A storage contact plug 118 is formed in a first insulating layer 104 on a semiconductor substrate. A second insulating layer 110, a material layer 112, and a third insulating layer 114 are sequentially formed on the first insulating layer. The material layer prevents etchant of the third insulating layer from attacking the second insulating layer. The third insulating layer, the material layer, and the second insulating layer are sequentially etched to form an opening exposing the storage contact plug and a portion of the surface of the first insulating layer. The opening is filled with a conductive layer to form a storage node 116. The third insulating layer is etched until the top surface of the material layer is exposed, and the material layer is etched until the top surface of the second insulating layer is exposed. Overetching is thus prevented, avoiding collapse or breakage of the storage node, dielectric leakage, and defective step coverage of upper electrodes.

11 Claims, 4 Drawing Sheets

METHOD FOR FABRICATING A DRAM CELL STORAGE NODE

BACKGROUND OF THE INVENTION

1. Field of the Invention

The present invention relates to a method for fabricating a semiconductor device, and more particularly to a method for fabricating a dynamic random access memory (DRAM) cell storage node.

2. Description of the Related Art

Dynamic random access memory (DRAM) devices may be divided into a stack type, a trench type, and other types. The trench type is chiefly used in high integration DRAM devices. Accordingly, the present invention will be described in view of a stack type capacitor.

Elements constituting DRAM devices have been gradually scaled down in size to achieve high integration in DRAM devices. Due to this size reduction, it is very difficult to maintain the required capacitance of the capacitors used for data storage in DRAM devices and perform the photo and etching processes to form the elements. Misalignment of sequentially formed elements in a DRAM is a common problem.

FIG. 1A to FIG. 1C sequentially illustrate the process steps of forming a DRAM device where misalignment has occurred. First, referring to FIG. 1A and FIG. 1B, an interlayer insulating film 14 including bit lines 16 formed on a semiconductor substrate 10 is penetrated, so that buried contacts (i.e., storage contact plugs) 18 are formed. The storage contact plugs 18 are electrically connected to the semiconductor substrate 10 between shallow trenches 12. Then, a polysilicon layer 20 is formed on the interlayer insulating film 14 to form the storage nodes (e.g., stack type capacitors).

Referring to FIG. 1C, a mask (not shown) is formed on the polysilicon layer 20 using a photo-etching process in order to define a storage node formation region. The storage nodes 20a are formed using a polysilicon layer etching process using the mask. To increase the efficient surface area of the storage nodes 20a, a hemispherical grain (HSG) layer is formed on the surface areas thereof. Then, to form the storage node capacitors, a capacitor formation dielectric film (not shown) is deposited on the insulating layer 14 and the storage nodes 20a, and a conductive layer (not shown) is deposited to form upper electrodes.

In the foregoing method, if the mask is misaligned with the storage contact plugs 18, a few problems may be generated. The etching process of the polysilicon layer 20 conventionally includes overetching of the polysilicon to prevent electrical bridging between storage nodes 20a. As a result, the polysilicon of the upper region of the storage contact plugs 18 is etched during this overetching if there is any misalignment. In addition, the interlayer insulating film 14 connected to the storage nodes 20a is etched by the cleaning material used in subsequent cleaning processes. As a result, the area of contact between a storage node 20a and a storage contact plug 18 and the interlayer insulating film 14 is reduced. This reduction of contact area generates increased resistance and may result in the collapse or breakage of the storage node 20a during subsequent processing. These problems become severe in high integration DRAM devices, and are inevitable in very large scale integration (VLSI) devices such as 1Gbit DRAM devices.

One of the methods for solving these problems is to form the storage node using a damascene process. Referring to FIG. 2A to FIG. 2C, a first insulating layer 54 including bit lines 56 formed on a semiconductor substrate 50 is penetrated to form storage contact plugs 60 which are electrically connected to the semiconductor substrate 50 between trenches 52. It should be noted that FIG. 2A to FIG. 2C show an etch stop layer 58 which is not used in this method, but is used in a variation of this method described below.

Then, a second insulating layer 62 is formed on the first insulating layer 54. The second insulating layer 62 is partially etched to form openings and to expose the top surfaces of the storage contact plugs 60 for formation of the storage nodes 64. After forming the storage nodes 64 by filling the openings with polysilicon, the surface area of the storage nodes 64 is exposed by etching the second insulating layer 62 around the storage nodes 64. This process must be controlled to achieve the required capacitance of the capacitor being formed.

However, this method has a few problems. The capacitance of the capacitors formed by the method varies according to the quantity of the second insulating layer 62 that is etched on the sides of the storage node 64 by the conventional wet etch or dry etch in the etching process. Further, if the second insulating layer 62 is overetched, a bit line which is in a peripheral circuit region of the DRAM device may be exposed to attack during subsequent formation of the upper electrodes.

Referring again to FIG. 2A to FIG. 2C, a variation on the above process for forming a storage node is shown in the case of a misalignment. Referring to FIG. 2A, an insulating etch-stop layer 58, whose etch selectivity is high with respect to an oxide layer such as a silicon nitride layer, is generally formed on the first insulating layer 54, before or after formation of storage contact plugs 60.

As shown in FIG. 2B to FIG. 2C, the storage node formation region is misaligned with the storage contact plugs 60. As a result, when the storage nodes 64 are formed the first insulating layer 54 may be partially etched in the upper region of the storage contact plugs 60. Etchant may penetrate along the interface between the storage nodes 64 and the etch stop layer 58, so that a recessed region is created, as shown in FIG. 2C. As a result, dielectric leakage of the capacitors and defective step coverage of an upper electrode may occur, and reliability of the DRAM device is reduced.

SUMMARY OF THE INVENTION

The present invention is directed to overcoming or reducing the effects of the above problems. One feature of the invention is the prevention of unwanted etching of layers in the event of misalignment between two elements formed on a semiconductor substrate. In particular, one feature of the invention is the prevention of etching of the insulating layer surrounding a storage contact plug and the polysilicon forming the storage contact plug in the event of misalignment between a storage node and storage contact plug. Another feature of the invention is the increase in the contact area between the storage node and the storage contact plug. Another feature of the invention is to provide a method for fabricating a DRAM device with improved performance.

According to an aspect of the invention, a first insulating layer is formed on a semiconductor substrate, and a contact plug is formed in the first insulating layer electrically connected to the semiconductor substrate, a second insulating layer, a material layer, and third insulating layer are formed on the first insulating layer and contact plug. The third insulating layer, material layer, and second insulating layer are etched using at least one etchant to form an opening exposing the contact plug. A storage node is formed in the opening, and the third insulating layer is etched to expose a top surface of the material layer around the storage node. The material layer prevents etchant of the third insulating layer from etching the first or second insulating layer. Finally, the material layer is etched to expose a top surface of the second insulating layer around the storage node. Thus, overetching of the material forming the storage node is prevented, and dielectric leakage caused by such overetching and defective step coverage of upper electrodes is avoided.

The first insulating layer and the third insulating layer may comprise an oxide, such as USG, BPSG, HDP, or O3-TEOS. The second insulating layer may comprise SiN or SiON. The material layer may comprise a polysilicon.

The contact plug may be formed by etching the first insulating layer to form a contact hole, depositing a conductive material in the contact hole, and planarizing the conductive material to form the contact plug. The conductive material may comprise a doped amorphous silicon. The method may further comprise crystallizing the amorphous silicon, which may be accomplished using a thermal treatment process, at a temperature of about 500 degrees C. or higher.

The method may also include etching the second insulating layer until the first insulating layer is exposed around the storage node, and forming a rough surface film on a surface of the storage node.

BRIEF DESCRIPTION OF THE DRAWINGS

The features and advantages of the present invention will become more readily appreciated by reference to the following detailed description and the accompanying drawings, wherein.

DETAILED DESCRIPTION OF SPECIFIC EMBODIMENTS

Specific embodiments of the present invention will be explained below with reference to the accompanying drawings. Korean application no. 98-28191, filed Jul. 13, 1998, is hereby incorporated by reference as if fully set forth herein.

Figure 1A:
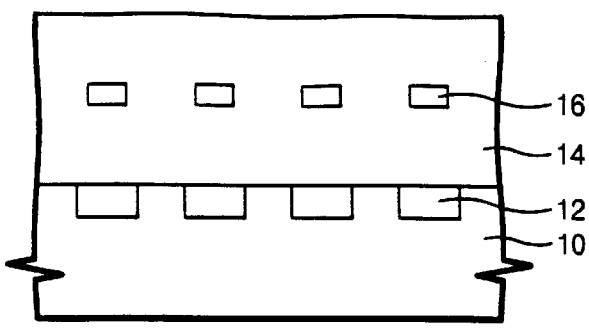
FIG. 1A to FIG. 1C are sectional views of a DRAM device showing a prior art method for fabricating a storage node where the storage node is misaligned.
Figure 1B:
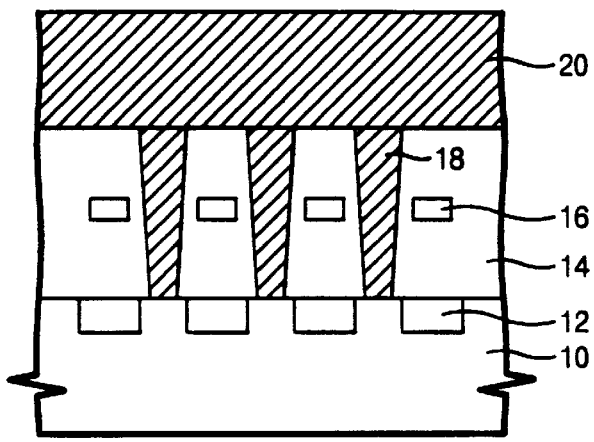
Figure 1C:
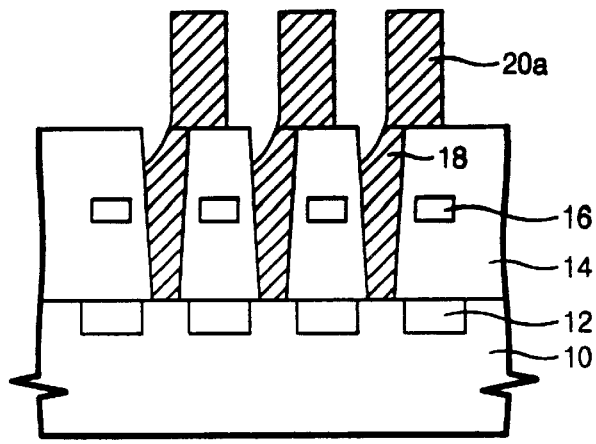
Figure 2A:
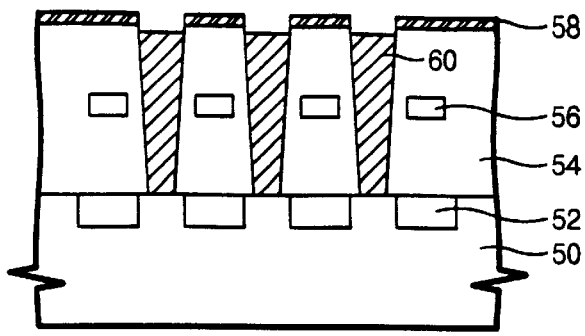
FIG. 2A to FIG. 2C are sectional views of a DRAM device showing a second prior art method for fabricating a storage node where the storage node is misaligned.
Figure 2B:
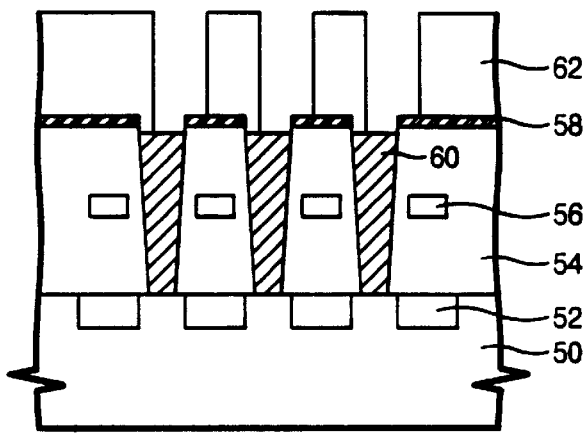
Figure 2C:
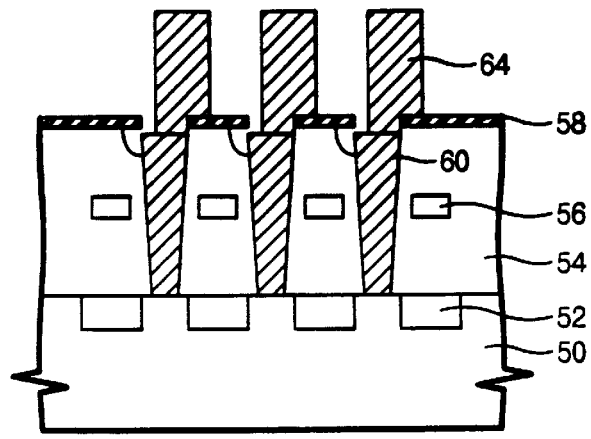
Figure 3A:
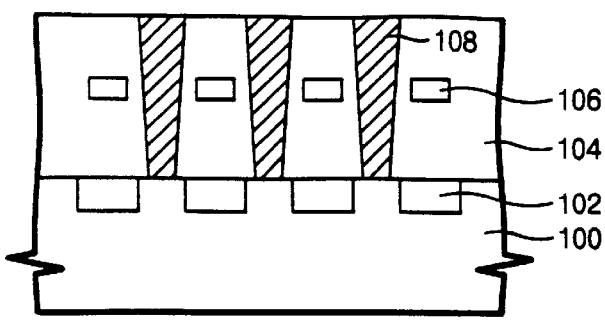
FIG. 3A to FIG. 3D are sectional views of a DRAM device showing a method for fabricating a storage node where the storage node is misaligned according to the present invention.

FIG. 3A to FIG. 3D sequentially illustrate the process steps for fabricating a DRAM device according to one embodiment of the present invention. Referring to FIG. 3A, an active region and an inactive region are defined on a semiconductor substrate 100, so that a device isolation region 102 is formed. A cell transistor (not shown) is formed on the active region.

The cell transistor includes a gate electrode and a source/drain diffusion layer. The gate electrode is formed of a gate oxide layer on the semiconductor substrate 100 and the source/drain diffusion layer is formed in the semiconductor substrate 100 around the gate electrode. Then, a pad is formed between gate electrodes of the cell transistor, electrically connected to the source/drain diffusion layer. A first insulating layer 104 including bit lines 106 is formed on the semiconductor substrate 100 including the cell transistor. For example, the first insulating layer 104 may be made from USG, BPSG, HDP, $O_3$-TEOS, or some other suitable insulating material.

A photoresist layer (not shown) is formed on the first insulating layer 104. The photoresist layer is patterned through a conventional photo-etching process, so that a first photoresist pattern defining storage contact holes is formed. Using the first photoresist pattern as a mask, the first insulating layer 104 is partially etched to form storage contact holes exposing the top surfaces of the pads. Then, the photoresist pattern is removed. Next, a first conductive layer is formed to fill the storage contact holes in the first insulating layer. Then, the portions of the first conductive layer on the surface of the first insulating layer 104 around the storage contact holes is removed to form storage contact plugs 108. As an example, the first conductive layer may be made of polysilicon doped with an impurity ion, or some other suitable conductive material. The first conductive layer is etched using a chemical mechanical polishing (CMP) process or an etch-back process.

Then, a thermal treatment process is performed to crystalize the storage contact plugs 108. The thermal treatment process is performed at a temperature of about 550° C. or higher. If the storage contact plugs 108 are misaligned with the subsequently formed storage nodes, an HSG layer to increase the efficient surface area of the storage nodes is formed on the top surface of the storage contact plugs, thereby preventing electrical bridging between the storage nodes. The HSG layer is not grown on the crystalized polysilicon layer. The thermal treatment may be omitted if processing at a temperature of about 550° C. or higher was performed before formation of the HSG layer.

Figure 3B:
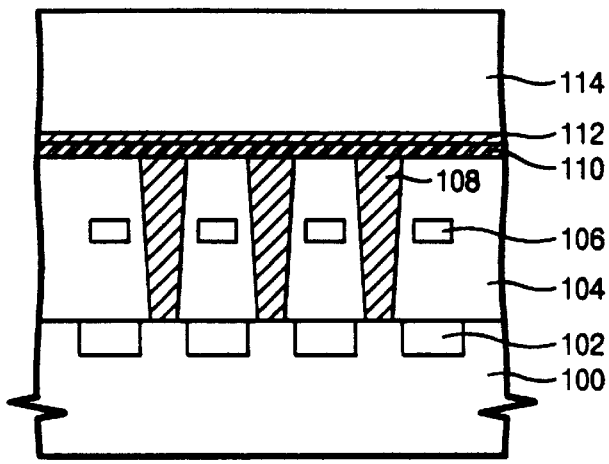

Referring to FIG. 3B, a second insulating layer 110 is formed on the first insulating layer 104. For example, the second insulating layer may be made of silicon nitride, preferably either SiN or SiON. If the storage nodes are misaligned with the storage contact plugs 108, the second insulating layer 110 may prevent the etching of the upper region of the storage contact plug during etching processes. The second insulating layer 110 is preferably formed with a thickness of about 100 to 500 Angstroms.

A material layer 112 may be formed on the second insulating layer 110 to prevent etchant from etching the first insulating layer 104. For example, during subsequent etching steps, etchant is prevented from penetrating the first insulating layer 104 by the material layer 112. For example, the material layer 112 may be made of polysilicon with a thickness of about 300 to 1,000 Angstroms.

Figure 3C:
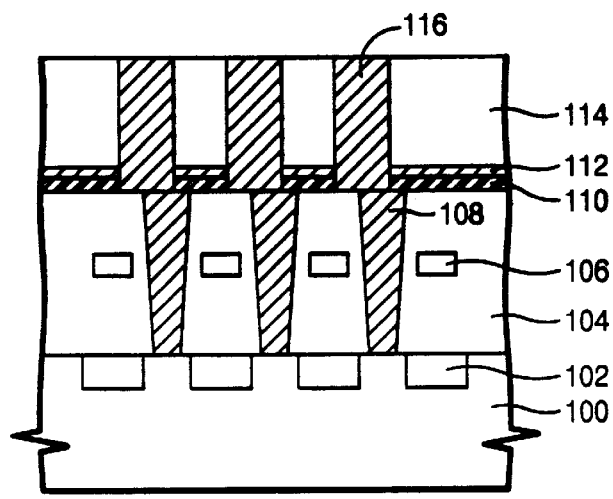

A third insulating layer 114 is formed on the material layer 112. For example, the third insulating layer 112 may be made of USG, BPSG, HDP, $O_3$-TEOS, or some other suitable insulating material, with a thickness of about 6,000 to 15,000 Angstroms. A second photoresist layer is formed on the third insulating layer 114. The second photoresist layer is patterned by a conventional photo-etching process, so that a second photoresist pattern is formed. Using the second photoresist pattern as a mask, the third insulating layer 114, the material layer 112, the second insulating layer 110 is sequentially etched to form openings exposing a partial top surface of the first insulating layer 104 and a top surface of the storage contact plug 108, as shown in FIG. 3C.

After removal of the second photoresist pattern, a second conductive layer is formed on the third insulating layer 114 so as to fill the openings. Removing undesirable portions of the second conductive layer around the openings, a storage node 116 is formed.

The third insulating layer 114 is etched until the material layer 112 on both sides of the storage node 116 is exposed. As mentioned above, the material layer 112 prevents etchant used to etch the third insulating layer 114 from penetrating the interface between the second insulating layer 110 (i.e., the silicon nitride layer) and a side wall of the storage nodes 116. As a result, undesirable etching of the first insulating layer 104 is prevented. In addition, the material layer 112 serves as an etch-stop layer in the etching process, thereby providing a more stable etching process.

To prevent electrical bridging between storage nodes 116, the material layer 112 formed of polysilicon is preferably removed, by etching the material layer 112 after etching the third insulating layer 114. If the storage node 116 is misaligned with the storage contact plugs 108, the second insulating layer 110 prevents etching of the storage contact plugs 108 during the etching of material layer 112.

After etching the material layer 112, the second insulating layer 110 is etched until the top surface of the first insulating layer 104 is exposed. If an HSG layer is subsequently formed to increase the surface area of the storage node 116, the etching of the second insulating layer 110 may be omitted.

Figure 3D:
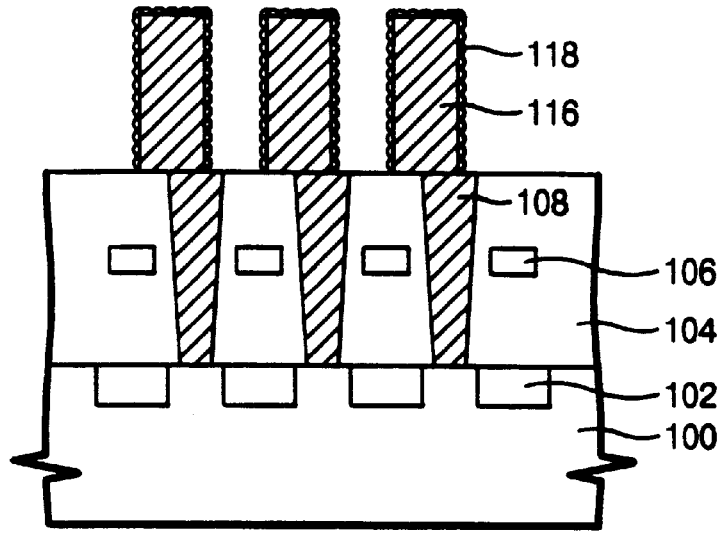

Referring to FIG. 3D, a rough surface film 118 is formed on the surface of storage nodes 116 to increase the efficient surface area of the nodes. For example, the rough surface film 118 may be made of HSG. Thus, a high capacitance capacitor is made.

Figure 4:
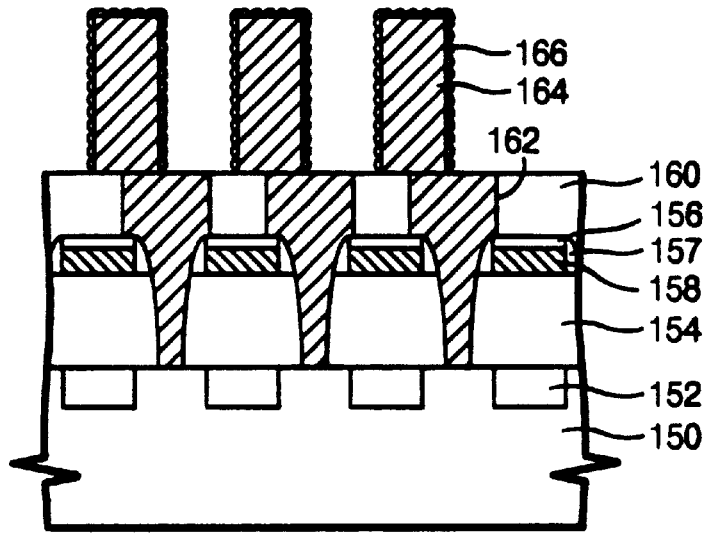
FIG. 4 is a sectional view of a second DRAM device according to the present invention.

Turning now to FIG. 4, a DRAM device constructed according to another embodiment of the invention is shown, where the storage node and storage contact plug are misaligned. Referring to FIG. 4, an active region and an inactive region are defined on a semiconductor substrate 150, so that a device isolation region 152 is delimited. A cell transistor (not shown) is formed on the semiconductor substrate 150 of the active region. A pad is formed between the gate electrodes of the cell transistor, electrically connected to the active region of the semiconductor substrate 150.

A first insulating layer 154 is formed on the semiconductor substrate 150 including the cell transistor. For example, the first insulating layer 154 may be made of USG, BPSG, HDP, $O_3$-TEOS, or some other suitable insulating material. Then, a conductive layer and the second insulating layer 156 are sequentially formed on the first insulating layer 154. For example, the second insulating layer 156 may be made of either SiN or SiON, or some other suitable insulating material.

A first photoresist layer is formed on the second insulating layer 156. The first photoresist layer is patterned by a conventional photo-etching process, so that a first photoresist pattern is formed. Using the first photoresist pattern as a mask, the second insulating layer 156 and the conductive layer are sequentially etched to form bit lines 158 whose top surfaces are covered by the second insulating layer 156. Then, a spacer formation insulating layer is formed on the first insulating layer 154 including the bit lines 158 after removal of the first photoresist pattern. The spacer formation insulating layer is anisotropically etched to form a spacer 157 on both sidewalls of the bit lines 158 and on the second insulating layer 156. The spacer may be made of either SiN or SiON, or some other suitable insulating material. Thus, the bit lines 158 are surrounded by spacer 157 and the second insulating layer 156, both having a different etch selectivity from the first insulating layer 154.

Next, a third insulating layer 160 is formed on the first insulating layer 154 including the bit lines 158, spacer 157, and second insulating layer 156. For example, the third insulating layer 160 may be made of USG, BPSG, HDP, $O_3$-TEOS, or some other suitable insulating material.

A second photoresist layer is formed on the third insulating layer 160. The second photoresist layer is etched by a conventional photo-etching process, so that a second photoresist pattern is formed. Using the second photoresist pattern as a mask, the third insulating layer 160 and the first insulating layer 154 is sequentially etched to form a self-aligned storage contact hole 162. The storage contact hole 162 passes between the bit lines 158. At this time, although the second photoresist pattern forming the storage contact hole is misaligned, the bit lines 158 are not exposed due to the third insulating layer 160 surrounding the bit line 158, the second insulating layer 156 with different etch selectivity from the first insulating layer 154, and the spacer 157.

Because of the presence of the second insulating layer 156 and the spacer 157 used to prevent exposure of the bit lines 158, the second photoresist pattern may be larger, resulting in the diameter of the upper portion of the storage contact hole 162 formed using the photoresist pattern being larger. The area of contact between the storage node 164 and storage plug formed in the storage contact hole 162 is also increased.

For example, an in device having a 0.30 $\mu$m pitch, if the diameter of a storage contact plug is 0.1 $\mu$m when formed using prior methods, the critical dimension (referred to below as C/D) of a bit line would be 0.1 $\mu$m so as to secure 0.05 $\mu$m misalignment margin. That is, the C/D of the storage contact plug and the bit lines should be small. However, if the C/D of the bit line is small, the bit line may be short, and the resistance of the bit line may increase. If the size of the storage contact plug is small, the resistance of the storage contact plug may increase, and a top surface of a semiconductor substrate is not exposed owing to slope etching characteristics during etching of an insulating layer for the storage contact plug.

If the foregoing self-aligned storage contact hole is formed, the diameter of the upper portion of the storage contact hole may be relatively larger than that of the storage node considering the misalignment margin and a space between the bit lines is a lower diameter of the storage contact plug.

If the diameter of the storage node is 0.1 $\mu$m and the misalignment margin is 0.05 $\mu$m in 0.30 $\mu$m device made according to the present embodiment, the diameter of the upper portion of the storage contact plugs is about 0.20 $\mu$m, and the space between the bit lines is about 0.10 $\mu$m. If the length of the spacer is about 0.03 $\mu$m on the side wall of the bit lines, the C/D of a practical bit line is about 0.14 $\mu$m. As a result, the photo and etching processes are easier than the in prior methods. After formation of buried contacts, a thermal treatment process crystalizing the storage contact plugs, a storage node formation process, and an HSG layer formation process are sequentially performed by the same method as described in the first embodiment above.

Thus, in cases of misalignment, the above-described methods are capable of preventing overetching of the polysilicon forming a storage node in a lower region of the storage node, dielectric leakage caused by overetching an insulating layer therein, and defective step coverage of upper electrodes. The described methods have the advantage of increasing the diameter of the upper portion of a storage contact plug (i.e., a buried contact), thereby securing enough overlap margin to the storage node. Further, the area of contact between the storage node and the buried contact is larger than in prior methods, thereby reducing the contact resistance of the elements.

Thus, a method for fabricating a DRAM cell storage node has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for fabricating a dynamic random access memory device comprising:

forming a first insulating layer on a semiconductor substrate;

forming a contact plug in the first insulating layer to be electrically connected to the semiconductor substrate;

forming a second insulating layer, a material layer, and a third insulating layer on the first insulating layer including the contact plug;

etching the third insulating layer, the material layer, and the second insulating layer using at least one etchant to form an opening exposing the contact plug;

forming a storage node in the opening;

etching the third insulating layer to expose a top surface of the material layer around the storage node, the material layer preventing the etchant of the third insulating layer from etching the first or the second insulating layer; and etching the material layer to expose a top surface of the second insulating layer around the storage node.

2. The method of claim 1, wherein the first insulating layer comprises an oxide selected from the group consisting of USG, BPSG, HDP, and O3-TEOS.

3. The method of claim 1, wherein the second insulating layer comprises a material selected from a group consisting of SiN and SiON.

4. The method of claim 1, wherein the material layer comprises a polysilicon.

5. The method of claim 1, wherein the third insulating layer comprises an oxide selected from the group consisting of USG, BPSG, HDP, and O3-TEOS.

6. The method of claim 1, wherein forming the contact plug comprises etching the first insulating layer to form a contact hole, depositing a conductive material in the contact hole, and planarizing the conductive material to form the contact plug.

7. The method of claim 6, wherein the conductive material comprises a doped amorphous silicon, the method further comprising crystallizing the amorphous silicon.

8. The method of claim 7, wherein crystallizing the amorphous silicon comprises a thermal treatment process.

9. The method of claim 8, wherein the thermal treatment process comprises treatment at a temperature of about 500 degrees C. or higher.

10. The method of claim 1, further comprising:

etching the second insulating layer until the first insulating layer is exposed around the storage node; and forming a rough surface film on a surface of the storage node.

11. The method of claim 7, further comprising:

etching the second insulating layer until the first insulating layer is exposed around the storage node; and forming a rough surface film on a surface of the storage node.

* * * * *